(12) United States Patent
Sato et al.

(10) Patent No.: US 8,405,128 B2
(45) Date of Patent: Mar. 26, 2013

(54) METHOD FOR ENHANCING GROWTH OF SEMIPOLAR (AL,IN,GA,B)N VIA METALORGANIC CHEMICAL VAPOR DEPOSITION

(75) Inventors: Hitoshi Sato, Kanagawa (JP); John F. Kaeding, Mountain View, CA (US); Michael Iza, Santa Barbara, CA (US); Benjamin A. Haskell, Santa Barbara, CA (US); Troy J. Baker, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 58 days.

(21) Appl. No.: 12/716,670

(22) Filed: Mar. 3, 2010

(65) Prior Publication Data

US 2010/0155778 A1 Jun. 24, 2010

Related U.S. Application Data

(63) Continuation of application No. 11/655,572, filed on Jan. 19, 2007, now Pat. No. 7,687,293.

(60) Provisional application No. 60/760,628, filed on Jan. 20, 2006.

(51) Int. Cl.
*H01L 31/06* (2012.01)

(52) U.S. Cl. ............ 257/201; 257/11; 257/79; 257/200; 257/E33.025; 257/E33.028; 257/E33.034

(58) Field of Classification Search .................... 257/11, 257/79–103, 189, 200, 201, 615, 745
See application file for complete search history.

(56) References Cited

U.S. PATENT DOCUMENTS

| | | | |
|---|---|---|---|
| 4,855,249 A | 8/1989 | Akasaki et al. | |
| 5,006,908 A | 4/1991 | Matsuoka et al. | |
| 5,741,724 A | 4/1998 | Ramdani et al. | |
| 6,153,010 A | 11/2000 | Kiyoku et al. | |
| 6,316,785 B1 | 11/2001 | Nunoue et al. | |
| 6,379,985 B1 | 4/2002 | Cervantes | |
| 6,515,308 B1 | 2/2003 | Kneissl | |
| 6,599,362 B2 | 7/2003 | Ashby et al. | |
| 6,847,057 B1 | 1/2005 | Gardner et al. | |

(Continued)

FOREIGN PATENT DOCUMENTS

| | | |
|---|---|---|
| EP | 0383215 | 8/1990 |
| JP | 02-211620 | 8/1990 |

(Continued)

OTHER PUBLICATIONS

Nishizuka et al., "Efficient radiative recombination from <1122> oriented InXGa1-XN multiple quantum wells fabricated by the regrowth technique", App. Phys. Lett. 85 No. 15 (2004) pp. 3122-3124.*

(Continued)

*Primary Examiner* — Leonard Chang
(74) *Attorney, Agent, or Firm* — Gates & Cooper LLP

(57) ABSTRACT

A method for enhancing growth of device-quality planar semipolar nitride semiconductor thin films via metalorganic chemical vapor deposition (MOCVD) by using an (Al, In, Ga)N nucleation layer containing at least some indium. Specifically, the method comprises loading a substrate into a reactor, heating the substrate under a flow of nitrogen and/or hydrogen and/or ammonia, depositing an $In_xGa_{1-x}N$ nucleation layer on the heated substrate, depositing a semipolar nitride semiconductor thin film on the $In_xGa_{1-x}N$ nucleation layer, and cooling the substrate under a nitrogen overpressure.

20 Claims, 3 Drawing Sheets

U.S. PATENT DOCUMENTS

| | | |
|---|---|---|
| 7,220,324 B2 | 5/2007 | Baker et al. |
| 2001/0009134 A1 | 7/2001 | Kim et al. |
| 2002/0069817 A1 | 6/2002 | Mishra et al. |
| 2002/0144645 A1 | 10/2002 | Kim et al. |
| 2003/0024475 A1 | 2/2003 | Anderson |
| 2005/0142391 A1 | 6/2005 | Dmitriev et al. |
| 2005/0161697 A1 | 7/2005 | Nakahata et al. |
| 2005/0258451 A1 | 11/2005 | Saxler et al. |
| 2007/0015345 A1 | 1/2007 | Baker et al. |
| 2007/0093073 A1 | 4/2007 | Farrell et al. |

FOREIGN PATENT DOCUMENTS

| | | |
|---|---|---|
| JP | 10-027940 | 1/1998 |
| JP | H10-341060 | 12/1998 |
| JP | 2003332697 | 11/2003 |
| JP | 2004-179457 | 6/2004 |
| JP | 2005057224 | 3/2005 |
| JP | 2005-167194 | 6/2005 |

OTHER PUBLICATIONS

Chakraborty, A., et al., "Milliwatt power blue InGaN/GaN light-emitting diodes on semipolar GaN templates", Japanese Journal of Applied Physics, Part 2 (Letters) Japan Soc. Appl. Phys Japan, vol. 44, No. 28-32, 2005, pp. L945-L947, XP002603839, ISSN: 0021-4922.

Hwang, J. S., et al., "Heteroepitaxy of gallium nitride on (0001), (1012) and (1010) sapphire surfaces", Journal of Crystal Growth, Elsevier, Amsterdam, NL LNKD-DOI:10.1016/0022-0248 (94) 90263-1, vol. 142, No. 1-2, Sep. 1, 1994, pp. 5-14, XP024439721, ISSN: 0022-0248.

Sharma, R., et al., "Demonstration of a semipolar(1013) InGaN/GaN green light emitting diode", Applied Physics Letters AIP USA, vol. 87, No. 23, Nov. 30, 2005, pp. 231110-1-231110-3, XP012076712 ISSN: 0003-6951.

European Search Report dated Nov. 4, 2010 (EP application No. 07716900.1).

Amano et al., "Metalorganic vapor phase epitaxial growth of a high quality GaN film using an AlN buffer layer," Appl. Phys. Lett., vol. 48, No. 5, Feb. 3, 1986, pp. 353-355.

Koleske et al., "Understanding GaN nucleation layer evolution on sapphire," Journal of Crystal Growth, 273, 2004, pp. 86-99.

Koleske et al., "In situ measurements in GaN nucleation layer decomposition," Applied Physics Letters, vol. 82, No. 8, 2003, pp. 1170-1172.

Moran et al., "Structural and morphological evolution of GaN grown by metalorganic chemical vapor deposition on SiC substrates using an AlN initial layer," Journal of Crystal Growth, 273, 2004, pp. 38-47.

Nakamura, "GaN growth using GaN buffer layer," Japanese Journal of Applied Physics, vol. 30, No. 10A, Oct. 1991, pp. L1705-L1707.

Nishizuka et al., "Efficient radiative recombination from (1122)-oriented $In_xGa_{1-x}N$ multiple quantum wells fabricated by the regrowth technique," Applied Physics Letters, vol. 85, No. 15, Oct. 11, 2004, pp. 3122-3124.

Shao, "Electrical characterization of semipolar gallium nitride thin films," 2005 NNIN REU Research Accomplishments, Aug. 2005, pp. 132-133.

JP Office Action dated May 25, 2012, Application No. 2008-551466, with English translation.

KR Office Action dated Mar. 19, 2012, Application No. 10-2008-7020306, with English translation.

George, T. et al., "Novel symmetry in the growth of gallium nitride on magnesium aluminate substrates," Appl. Phys. Lett. 68 (3) Jan. 15, 1996, 337.

Tempel, A. et al., "Zur epitaxie von Galliumnitrid auf nichtstochiometrischem Spinell im System GaCl/NH3/HE," Kristall und Technik, vol. 10, No. 7, 1975, pp. 747-758.

Baker et al., "Characterization of Planar Semipolar Gallium Nitride Films on Spinel Substrates". Japanese Journal of Applied Physics, vol. 44, No. 29, 2005, pp. L920-L922.

Korean Office Action dated Jul. 18, 2012 for JP application No. 10-2008-7020306.

JP Office Action dated Nov. 11, 2011, Application No. 2008-551466, with English translation.

International Search Report dated Aug. 24, 2007, Application No. PCT/US07/01700.

* cited by examiner

METHOD FOR ENHANCING GROWTH OF SEMIPOLAR (AL,IN,GA,B)N VIA METALORGANIC CHEMICAL VAPOR DEPOSITION

CROSS-REFERENCE TO RELATED APPLICATIONS

This application is a continuation under 35 U.S.C. Section 120 of and commonly-assigned U.S. patent application Ser. No. 11/655,572, filed on Jan. 19, 2007, by Hitoshi Sato, John Kaeding, Michael Iza, Troy J. Baker, Benjamin A. Haskell, Steven P. DenBaars and Shuji Nakamura, entitled "METHOD FOR ENHANCING GROWTH OF SEMIPOLAR (Al, In, Ga, B)N VIA METALORGANIC CHEMICAL VAPOR DEPOSITION", now U.S. Pat. No. 7,687,293, issued Mar. 3, 2010, which application claims the benefit under 35 U.S.C. Section 119(e) of commonly-assigned U.S. Provisional Patent Application Ser. No. 60/760,628 filed on Jan. 20, 2006, by Hitoshi Sato, John Kaeding, Michael Iza, Troy J. Baker, Benjamin A. Haskell, Steven P. DenBaars and Shuji Nakamura entitled "METHOD FOR ENHANCING GROWTH OF SEMIPOLAR (Al, In, Ga, B)N VIA METALORGANIC CHEMICAL VAPOR DEPOSITION", both of which applications are incorporated by reference herein.

This application is related to the following and commonly-assigned application:

U.S. patent application Ser. No. 11/372,914 filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,220,324, issued May 22, 2007, which application claims the benefit under 35 U.S.C. Section 119(e) of U.S. Provisional Patent Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE";

U.S. patent application Ser. No. 11/444,946, filed Jun. 1, 2006, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETEROSTRUCTURES, AND DEVICES," now U.S. Pat. No. 7,846,757, issued Dec. 7, 2010, which application claims the benefit under 35 U.S.C. Section 119(e) of U.S. Provisional Patent Application Ser. No. 60/686,244, filed Jun. 1, 2005, by Robert M. Farrell, Jr., Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETEROSTRUCTURES, AND DEVICES";

U.S. patent application Ser. No. 11/486,224, filed Jul. 13, 2006, by Troy J. Baker, Benjamin A. Haskell, James S. Speck and Shuji Nakamura, entitled "LATERAL GROWTH METHOD FOR DEFECT REDUCTION OF SEMIPOLAR NITRIDE FILMS," which application claims the benefit under 35 U.S.C. Section 119(e) of U.S. Provisional Patent Application Ser. No. 60/698,749, filed Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS";

U.S. patent application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION," now U.S. Pat. No. 7,575,947, issued Aug. 18, 2009, which application claims the benefit under 35 U.S.C. Section 119(e) of U.S. Provisional Patent Application Ser. No. 60/715,491, filed Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION";

U.S. patent application Ser. No. 11/655,573, filed on Jan. 19, 2007, by John Kaeding, Dong-Seon Lee, Michael Iza, Troy J. Baker, Hitoshi Sato, Benjamin A. Haskell, James S. Speck, Steven P. DenBaars and Shuji Nakamura, entitled "METHOD FOR IMPROVED GROWTH OF SEMIPOLAR (Al, In, Ga, B)N," now U.S. Pat. No. 7,691,658, issued Apr. 6, 2010, which application claims the benefit under 35 U.S.C. Section 119(e) of U.S. Provisional Patent Application Ser. No. 60/760,739, filed on Jan. 20, 2006, by John Kaeding, Michael Iza, Troy J. Baker, Hitoshi Sato, Benjamin A. Haskell, James S. Speck, Steven P. DenBaars and Shuji Nakamura, entitled "METHOD FOR IMPROVED GROWTH OF SEMIPOLAR (Al, In, Ga, B)N";

U.S. Provisional Patent Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al, In, Ga, B) N OPTOELECTRONICS DEVICES";

U.S. Provisional Patent Application Ser. No. 60/869,540, filed on Dec. 11, 2006, by Steven P. DenBaars, Mathew C. Schmidt, Kwang Choong Kim, James S. Speck and Shuji Nakamura, entitled "NON-POLAR (M-PLANE) AND SEMI-POLAR EMITTING DEVICES"; and U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura and James S. Speck, entitled "CRYSTAL GROWTH OF M-PLANE AND SEMIPOLAR PLANES OF (Al, In, Ga, B)N ON VARIOUS SUBSTRATES";

all of which applications are incorporated by reference herein.

BACKGROUND OF THE INVENTION

1. Field of the Invention

The invention is related to a method for enhancing growth of semipolar (Al, In, Ga, B)N via metalorganic chemical vapor deposition (MOCVD).

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

The usefulness of gallium nitride (GaN), and its ternary and quaternary compounds incorporating aluminum and indium (e.g., AlGaN, InGaN, AlInGaN), has been well established for the fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

GaN and its alloys are most stable in the hexagonal würtzite crystal structure, in which the structure is described by three equivalent basal plane axes that are rotated 120° with respect to each other (the a-axes), all of which are perpendicular to a unique c-axis. Group III (i.e., Ga, Al, In) and nitrogen atoms occupy alternating c-planes along the crystal's c-axis. The symmetry of the würtzite structure dictates that III-nitrides possess a bulk spontaneous polarization along this c-axis, and piezoelectric polarization arises when alternating strained layers are present in the device structure.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn yield lowered carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of Ga and N atoms and are charge-neutral. Furthermore, subsequent nonpolar layers are crystallographically equivalent to one another so the crystal will not be polarized along the growth direction. Two such families of symmetry-equivalent nonpolar planes in GaN are the {11$\bar{2}$0} family, known collectively as a-planes, and the {1$\bar{1}$00} family, known collectively as m-planes. Unfortunately, despite advances made by researchers at the University of California, the assignee of the present invention, growth of nonpolar nitrides remains challenging and has not yet been widely adopted in the III-nitride industry.

Another approach to reducing or possibly eliminating the polarization effects in GaN optoelectronic devices is to grow the devices on semipolar planes of the crystal. The term semipolar planes can be used to refer to a wide variety of planes that possess two nonzero h, i, or k Miller indices, and a nonzero 1 Miller index. Some commonly observed examples of semipolar planes in c-plane GaN heteroepitaxy include the {11$\bar{2}$2}, {10$\bar{1}$1}, and {10$\bar{1}$3} planes, which are often found in the facets of pits. These planes also happen to be the same planes that the authors have grown in the form of planar films. Other examples of semipolar planes in the würtzite crystal structure include, but are not limited to, {10$\bar{1}$2}, {20$\bar{2}$1}, and {10$\bar{1}$4}. The net electrical polarization vector lies neither within such planes or normal to such planes, but rather lies at some angle inclined to the plane's surface normal. For example, the 10$\bar{1}$1 and 10$\bar{1}$3 planes are at 62.98° and 32.06° to the c-plane, respectively.

In addition to spontaneous polarization, the second form of polarization present in nitrides is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice matching to the GaN. Therefore, for an InGaN quantum well on GaN, the piezoelectric polarization will point in the opposite direction to that of the spontaneous polarization of the InGaN and GaN. For an AlGaN layer latticed matched to GaN, the piezoelectric polarization will point in the same direction as that of the spontaneous polarization of the AlGaN and GaN.

The advantage of using semipolar planes over c-plane nitrides is that the net polarization will be reduced. There may even be zero polarization for specific alloy compositions on specific planes. Such scenarios will be discussed in detail in future scientific papers. The important point is that the net polarization will be reduced compared to that of c-plane nitride structures.

Bulk crystals of GaN are not readily available, so it is not possible to simply cut a crystal to present a surface for subsequent device regrowth. Commonly, GaN films are initially grown heteroepitaxially, i.e. on foreign substrates that provide a reasonable lattice match to GaN.

Semipolar GaN planes have been demonstrated on the sidewalls of patterned c-plane oriented stripes. Nishizuka et al. [1] have grown {11$\bar{2}$2} InGaN quantum wells by this technique. They have also demonstrated that the internal quantum efficiency of the semipolar plane {11$\bar{2}$2} is higher than that on the c-plane, which results from the reduced net electrical polarization.

However, Nishizuka's method of producing semipolar planes is drastically different than that of the current invention because it relies on an artifact of the Epitaxial Lateral Overgrowth (ELO) technique. ELO is a cumbersome processing and growth method used to reduce defects in GaN and other semiconductors. It involves patterning stripes of a mask material such as silicon dioxide ($SiO_2$). The GaN is re-grown from open windows between the mask and then grown over the mask. To form a continuous film, the GaN is then coalesced by lateral growth. The facets of these stripes can be controlled by the growth parameters. If the growth is stopped before the stripes coalesce, then a small area of semipolar plane, typically 10 μm wide at best, can be exposed, but this available surface area is too small to process into a semipolar LED. Furthermore, the semipolar plane will be not parallel to the substrate surface, and forming device structures on inclined facets is significantly more difficult than forming those structures on normal continuous planes. Also, not all nitride compositions are compatible with ELO processes and therefore only ELO of GaN is widely practiced.

Nucleation, buffer, and/or wetting layers have been extensively used in the growth of high-quality nitrides since the early 1990s [2,3]. This technique typically employs the use of a thin layer (5 nm-200 nm) of polycrystalline and/or amorphous nitride semiconductor material prior to the deposition of a thicker (1 μm-5 μm) nitride semiconductor continuous film. While the advantages of using nucleation layers (NLs) in heteroepitaxy of GaN thin films is well established, the mechanisms for how the NLs improve crystal quality are not well understood. It is believed that NLs provide nucleation sites onto which high-quality nitride films then deposit [4,5]. The latter deposition shows a dramatic improvement in crystal, electrical, and optical properties compared to nitrides deposited without a NL.

Although the use of NLs has been extensively documented for nitride thin films, they comprise of nitrides grown only in the [0001] or c-axis crystallographic direction. In contrast, the use of nucleation layers for semipolar planes such as {11$\bar{2}$2} has not been previously achieved.

The present invention discloses a method for growth of smooth planar films of semipolar nitrides, in which a large usable area of (Al, In, Ga, B)N is parallel to the substrate surface. For example, samples are often grown on 2-inch diameter substrates, compared to the few micrometer wide areas previously demonstrated on sidewalls of ELO stripes.

SUMMARY OF THE INVENTION

The present invention discloses a method for enhancing growth of a device-quality planar semipolar nitride semiconductor thin film comprising the step of depositing the semipolar nitride semiconductor thin, typically 50 Å-1000 Å thick, film on an (Al, In, Ga)N nucleation or buffer layer containing at least some indium. The (Al, In, Ga)N nucleation or buffer layer may comprise an $In_xGa_{1-x}N$ nucleation layer with x>0, for example x=0.1. The semipolar nitride semiconductor thin film may comprise an alloy composition of (Ga, Al, In, B)N semiconductors having a formula $Ga_nAl_xIn_yB_zN$ where $0 \leq n \leq 1$, $0 \leq x \leq 1$, $0 \leq y \leq 1$, $0 \leq z \leq 1$ and n+x+y+z=1. An area greater than 10 microns wide of the (Ga, Al, In, B)N semiconductors may be substantially parallel to a substrate surface upon which the (Al, In, Ga)N nucleation or buffer layer is grown.

The (Al, In, Ga)N nucleation or buffer layer may be grown on a (10$\bar{1}$0) sapphire substrate. The semipolar nitride semiconductor thin film may comprise a {11$\bar{2}$2} semipolar nitride semiconductor thin film grown on the (Al, In, Ga)N nucleation or buffer layer grown on a (10$\bar{1}$0) sapphire substrate. The (Al, In, Ga)N nucleation or buffer layer may alternatively be grown on an {11$\bar{2}$2} GaN template grown by, for example, hydride vapor phase epitaxy on a (10$\bar{1}$0) sapphire substrate. The semipolar nitride semiconductor thin film may be grown via metalorganic chemical vapor deposition (MOCVD).

The semipolar nitride semiconductor thin film has a surface morphology needed for state-of-the-art nitride semipolar electronic devices, comprising a planar film surface, fewer surface undulations, and a reduced number of crystallographic defects present in the film compared to film grown without the (Al, In, Ga)N nucleation or buffer layer.

The method for growing device-quality planar semipolar nitride semiconductor thin films may comprise (a) loading a substrate into a reactor, (b) heating the substrate under a flow comprising at least one of nitrogen, hydrogen and ammonia, (c) depositing an $In_xGa_{1-x}N$ nucleation layer on the heated substrate, (d) depositing a semipolar nitride semiconductor thin film on the $In_xGa_{1-x}N$ nucleation layer and (e) cooling the substrate under a nitrogen overpressure.

A device may be fabricated using the method of the present invention. The present invention also discloses a planar semipolar nitride semiconductor thin film comprising semipolar nitride deposited on a nucleation layer or buffer layer comprising indium.

BRIEF DESCRIPTION OF THE DRAWINGS

Referring now to the drawings in which like reference numbers represent corresponding parts throughout:

FIGS. 2(a), 2(b) and 2(c) are optical micrographs of GaN on (10$\bar{1}$0) sapphire, wherein FIG. 2(a) is an optical micrograph of GaN on (10$\bar{1}$0) sapphire without a nucleation layer, FIG. 2(b) is an optical micrograph of GaN on (10$\bar{1}$0) sapphire with an $In_xGa_{1-x}N$ nucleation layer where x=0, and FIG. 2(c) is an optical micrograph of GaN on (10$\bar{1}$0) sapphire with an $In_xGa_{1-x}N$ nucleation layer where x=0.1.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a method for growing device-quality planar semipolar (e.g. {11$\bar{2}$2} plane) nitride semiconductor thin films via MOCVD by using an (Al, In, Ga)N nucleation layer containing at least some indium. Growth of semipolar nitride devices on planes (for example, the {11$\bar{2}$2} and {10$\bar{1}$3} planes of GaN), offers a means of reducing polarization effects in würtzite-structure III-nitride device structures. The term "nitrides" refers to any alloy composition of the (Ga, Al, In, B)N semiconductors having the formula $Ga_nAl_xIn_yB_zN$ where $0 \leq n \leq 1$, $0 \leq x \leq 1$, $0 \leq y \leq 1$, $0 \leq z \leq 1$ and n+x+y+z=1.

Current nitride devices are grown in the polar [0001] c-direction, which results in charge separation along the primary conduction direction in vertical devices. Such internal electrical polarization fields are detrimental to the performance of nitride optoelectronic devices. Growth of these devices along a semipolar direction could improve device performance significantly by reducing built-in electric fields along the conduction direction. The present invention provides a means of enhancing semipolar III-nitride film quality when grown by metalorganic chemical vapor deposition.

In this specification, {11$\bar{2}$2} GaN films are used as a specific example. For {11$\bar{2}$2} films, (10$\bar{1}$0) sapphire substrates have been used. In order to obtain planar semipolar GaN, it has been found that it is critical to use an $In_xGa_{1-x}N$ nucleation layer prior to GaN growth.

These films were grown using a commercially available MOCVD system. A general outline of growth parameters for {11$\bar{2}$2} GaN is a pressure between 10 torr and 1000 torr, and a temperature between 400° C. and 1400° C. This variation in pressure and temperature is indicative of the stability of the growth of semipolar GaN using a suitable substrate. The epitaxial relationships and conditions should hold true regardless of the type of reactor. However, the reactor conditions for growing these planes will vary according to individual reactors and growth methods (HVPE, MOCVD, and MBE, for example).

Process Steps

Figure 1:
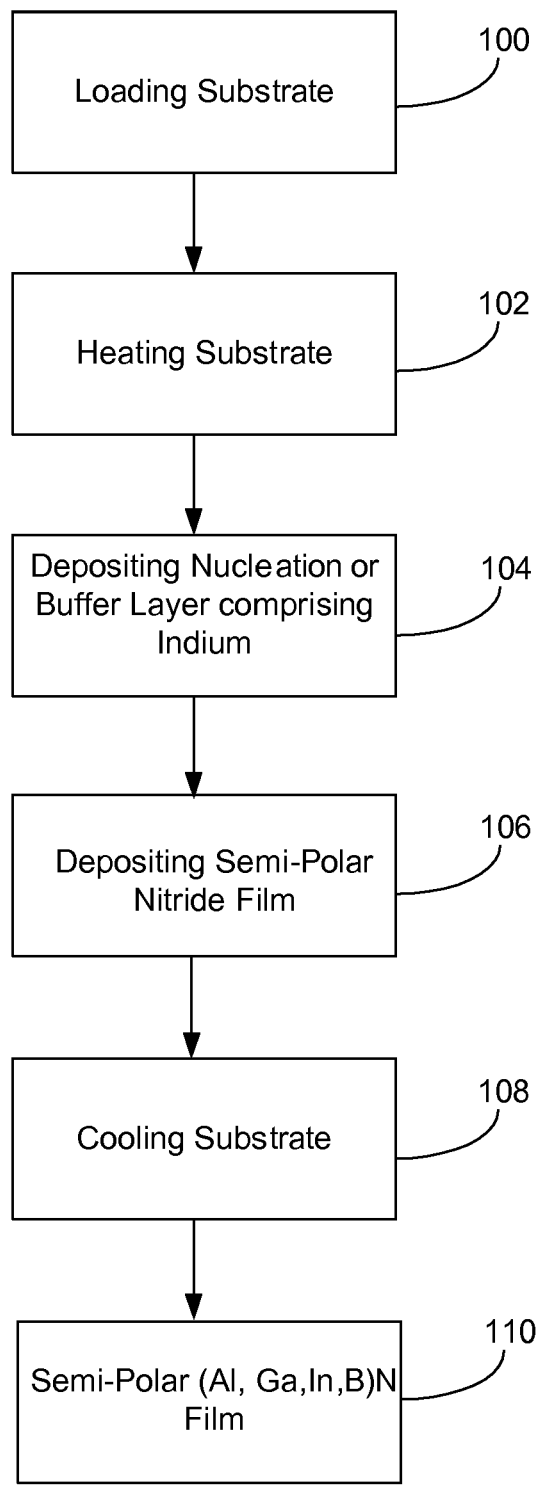
FIG. 1 is a flow chart illustrating the method of the present invention and the process steps performed in an embodiment of the present invention.

FIG. 1 is a flowchart that illustrates a method for enhancing growth of a device-quality planar semipolar nitride semiconductor thin film, typically 50 Å-1000 Å thick, comprising depositing the semipolar nitride semiconductor thin film on an (Al, In, Ga)N nucleation or buffer layer containing at least some indium.

Block 100 represents the step of loading a substrate in a reactor, for example, an MOCVD reactor.

Block 102 represents the step of heating the substrate, for example, under hydrogen and/or nitrogen and/or ammonia flow.

Block 104 represents the step of depositing an (Al, In, Ga)N nucleation or buffer layer, comprising at least some indium, on the substrate.

Block 106 represents the step of depositing a semipolar nitride film on the nucleation or buffer layer.

Block 108 represents the step of cooling the substrate.

Block 110 represents how the method results in the formation of a semipolar semiconductor thin (Al, Ga, In B)N film, which may be an alloy and may have a formula $Ga_nAl_xIn_yB_zN$ where $0 \leq n \leq 1$, $0 \leq x \leq 1$, $0 \leq y \leq 1$, $0 \leq z \leq 1$ and $n+x+y+z=1$.

In the method presented above, steps may be omitted as desired and additional steps may be added.

The above method can be used in an MOCVD process for the growth of semipolar GaN thin films on (10$\bar{1}$0) sapphire substrates, or on {11$\bar{2}$2} GaN templates which are grown by hydride vapor phase epitaxy (HVPE) on (10$\bar{1}$0) sapphire substrates.

For the growth of {11$\bar{2}$2} GaN, a specific substrate such as (10$\bar{1}$0) sapphire or a {11$\bar{2}$2} GaN template (grown by HVPE on (10$\bar{1}$0) sapphire) is used. The substrate is loaded into an MOCVD reactor, as shown in Block 100. The heater for the reactor is turned on and ramped to 800° C. to grow an $In_xGa_{1-x}N$ nucleation layer, as shown in Block 102. The process generally flows nitrogen and/or hydrogen and/or ammonia over the substrate at atmospheric pressure during this step. During ramping to 800° C., the ammonia flow is increased 0.1 to 3.2 slpm. Once the set point temperature is reached, 45 sccm of Triethylgallium (TEGa) and/or 20 sccm of Trimethylindium (TMIn) are introduced into the reactor to initiate the $In_xGa_{1-x}N$ nucleation layer growth, as shown in Block 104. After 1-15 minutes, the $In_xGa_{1-x}N$ nucleation layer reaches the desired thickness. At this point, the TMIn flow is shut off and thin GaN cap layer is grown for 2 minutes. Then, the TEGa flow is shut off and the reactor set point temperature is increased to 975° C. Once the set point temperature of 975° C. is reached, 36 sccm of Trimethylgallium (TMGa) is introduced into the reactor to initiate the growth of the semipolar nitride film, as shown in Block 106. After 7 minutes of initial GaN growth, the TMGa flow and the ammonia flow are reduced to 18 sccm and 1.5 slpm, respectively, for approximately 1 to 4 hours of GaN film growth. Once the desired GaN thickness is achieved, the TMGa flow is interrupted and the reactor is cooled down while flowing ammonia to avoid GaN film decomposition, as shown in Block 108.

Possible Modifications and Variations

The scope of the present invention covers more than just the particular example set forth above. This idea is pertinent to all nitride films of any semipolar plane. For example, one could grow {11$\bar{2}$2} AN, InN, AlGaN, InGaN, or AlInN on a miscut (10$\bar{1}$0) sapphire substrate. Another example is that one could grow a {10$\bar{1}$2} film, if the proper substrate, such as {10$\bar{1}$4} 4H—SiC, is used. These examples and other possibilities still possess all of the benefits of planar semipolar films. The present invention idea covers any growth technique that generates a planar semipolar nitride film by using a nitride buffer or nucleation layer.

The reactor conditions will vary by reactor type and design. The growth described above is only a description of one set of conditions that has been found to be useful conditions for the growth of semipolar GaN. It was also discovered that these films will grow under a wide range of pressures, temperatures, gas flows, etc., all of which will generate smooth planar semipolar nitride films.

There are other steps that could vary in the growth process. It has been found that nitridizing the substrate improves surface morphology for some films, and determines the actual plane grown for other films. However, this may or may not be necessary for a particular growth technique.

The preferred embodiment described the growth of a planar GaN film on an InGaN nucleation layer. However, the film grown upon the nucleation layer may be comprised of multiple layers having varying or graded compositions. The majority of nitride devices are comprised of heterostructures containing layers of dissimilar (Al, Ga, In, B)N composition. The present invention can be used for the growth of any nitride alloy composition and any number of layers or combination thereof. Dopants, such as Fe, Si, and Mg, are frequently used in nitride layers. The incorporation of these and other dopants not specifically listed is compatible with the practice of this invention.

Advantages and Improvements

The existing practice is to grow GaN with the c-plane parallel to the substrate. This plane has a spontaneous polarization and piezoelectric polarization both oriented perpendicular to the film, which is detrimental to device performance. The advantage of semipolar films over c-plane nitride films is the reduction in polarization and the associated increase in internal quantum efficiency for certain devices.

Nonpolar planes could be used to completely eliminate polarization effects in devices. However, devices on these planes can be quite difficult to grow, thus nonpolar nitride devices are not yet in production. The advantage of semipolar over nonpolar nitride films is the ease of growth. The present invention has demonstrated that smooth semipolar films will grow in a large growth parameter space. For example, smooth nonpolar films will not grow at atmospheric pressure, but smooth semipolar films have been experimentally demonstrated to grow at pressures ranging from 62.5 torr to 760 torr.

The advantage of planar semipolar films over ELO sidewalls is the large surface area that can be processed into an LED or other device. Another advantage is that the growth surface is parallel to the substrate surface, unlike that of semipolar planes on ELO sidewalls.

Figure 2A:
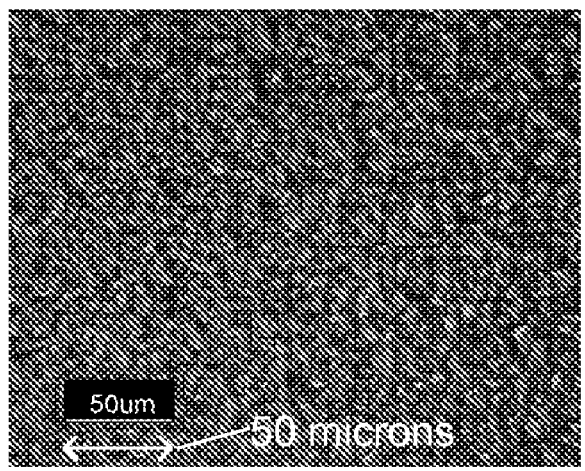
Figure 2B:
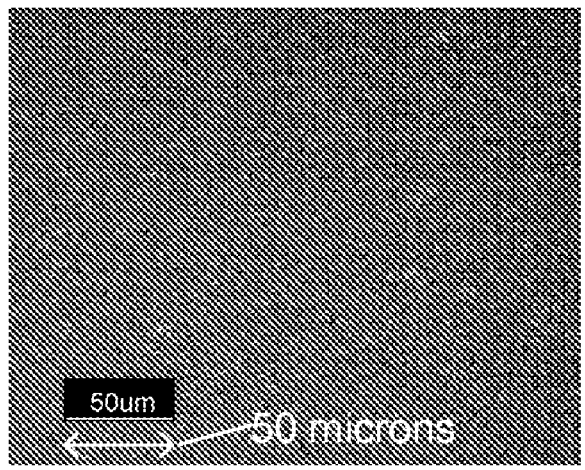
Figure 2C:
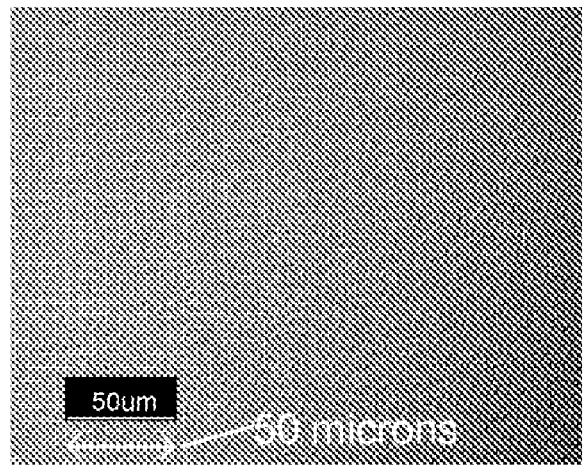

The use of an $In_xGa_{1-x}N$ nucleation layer with x=0.1 prior to high-temperature GaN growth has been shown to significantly improve the growth of semipolar GaN thin films. This is apparent in the optical micrographs of FIGS. 2(*a*), 2(*b*) and 2(*c*). These optical micrographs show a striking improvement in the smoothness of a {11$\bar{2}$2} GaN layer grown on (10$\bar{1}$0) sapphire by incorporating the buffer layer described in the preferred embodiment. FIG. 2(*a*) shows that without the use of a nucleation layer, the GaN film is comprised of a large number of non-coalesced, facetted islands. Thus, the film may have large numbers of small GaN crystals oriented in various directions. FIG. 2(*b*) shows that with the use of a GaN nucleation layer, the GaN film growth is completely hazy. Films of this quality cannot be used for the fabrication of optoelectronic devices. On the other hand, the use of an $In_xGa_{1-x}N$ nucleation layer with x=0.1, as shown in FIG. 2(*c*), leads to a substantial improvement in surface morphology. Semipolar GaN thin films using an $In_xGa_{1-x}N$ buffer layer with x=0.1 have the surface morphology needed for state-of-the-art nitride semipolar electronic devices. These features are: a planar film surface and few surface undulations as seen in FIGS. 2(*a*), 2(*b*), and 2(*c*). FIG. 2(*c*) also shows a large usable area, greater than 300 μm by 300 μm, of the (Ga, Al, In, B)N semiconductor substantially parallel to the substrate surface.

Similarly, the morphological dependence on NLs described above has been observed for a {11$\bar{2}$2} GaN layer grown on a {11$\bar{2}$2} GaN template which is first grown by HYPE.

Figure 3:
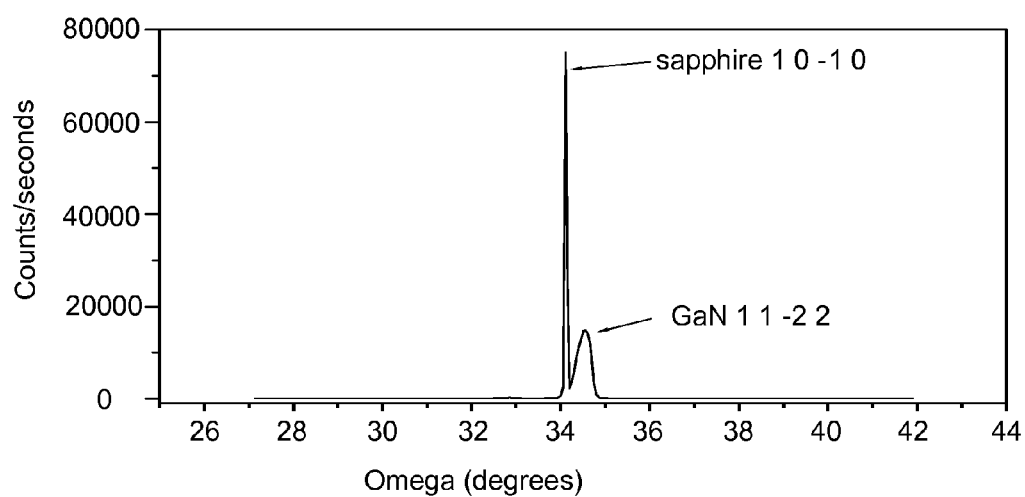
FIG. 3 is a graph of an omega-2 theta X-Ray Diffraction (XRD) scan of a semipolar GaN film grown on (10$\bar{1}$0) sapphire with an $In_xGa_{1-x}N$ nucleation layer (with x=0.1) grown by MOCVD.

FIG. 3 shows an X-ray Diffraction (XRD) ω-2θ scan for on-axis reflections. No {11$\bar{2}$2} GaN peaks are observed from the films grown without the use of a nucleation layer, or grown with the use of a GaN nucleation layer. Only with the use of an $In_xGa_{1-x}N$ nucleation layer with x=0.1, an obvious peak from the {11$\bar{2}$2} GaN film can be observed. This result indicates an improvement in the growth of the semipolar {11

22} GaN film grown using an $In_xGa_{1-x}N$ nucleation layer with x=0.1 by MOCVD, as described in the preferred embodiment of this invention.

The same approach can be applied to other semipolar planes such as {10$\bar{1}$3} and {10$\bar{1}$1}. Although the specific growth conditions for these other semipolar planes may differ, the general techniques described above are intended to cover the entire class of (Al, In, Ga, B)N semipolar planes.

REFERENCES

The following references are incorporated by reference herein:

[1] Nishizuka, K., Applied Physics Letters, Vol. 85 Number 15, 11 Oct. 2004. This paper is a study of {11$\bar{2}$2} GaN sidewalls of ELO material.
[2] H. Amano, N. Sawaki, I. Akasaki and Y. Toyoda, Applied Physics Letters Vol. 48 (1986) pp. 353. This paper describes the use of an AlN buffer layer for improvement of GaN crystal quality.
[3] S, Nakamura, Japanese Journal of Applied Physics Vol. 30, No. 10A, October, 1991, pp. L1705-L1707. This paper describes the use of a GaN buffer layer for improvement of GaN crystal quality.
[4] D. D. Koleske, M. E. Coltrin, K. C. Cross, C. C. Mitchell, A. A. Allerman, Journal of Crystal Growth Vol. 273 (2004) pp. 86-99. This paper describes the effects of GaN buffer layer morphology evolution on a sapphire substrate.
[5] B. Moran, F. Wu, A. E. Romanov, U. K. Mishra, S. P. Denbaars, J. S. Speck, Journal of Crystal Growth Vol. 273 (2004) pp. 38-47. This paper describes the effects of AlN buffer layer morphology evolution on a silicon carbide substrate.
[6] U.S. Pat. No. 4,855,249, issued on Aug. 8, 1989, to Akasaki, et al., and entitled "Process for growing III-V compound semiconductors on sapphire using a buffer layer."
[7] U.S. Pat. No. 5,741,724, issued on Apr. 21, 1998, to Ramdani, et al., and entitled "Method of growing gallium nitride on a spinel substrate."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semiconductor film, comprising:
a semipolar III-nitride semiconductor film deposited on a nitride nucleation or buffer layer, wherein:
the nitride nucleation or buffer layer includes at least some indium,
a surface area greater than 10 microns wide of the semipolar III-nitride semiconductor film is substantially parallel to a substrate surface upon which the nitride nucleation or buffer layer is grown, and
the semipolar III-nitride semiconductor film has a surface morphology comprising a planar film surface with fewer surface undulations and a reduced number of crystallographic defects as compared to a semipolar III-nitride semiconductor film grown without the nucleation or buffer layer.

2. The film of claim 1, wherein the nitride nucleation or buffer layer is grown on a (10$\bar{1}$0) sapphire substrate.

3. The film of claim 1, wherein the nitride nucleation or buffer layer is grown on an {11$\bar{2}$2} gallium nitride template grown on a (10$\bar{1}$0) sapphire substrate.

4. The film of claim 1, wherein the semipolar III-nitride semiconductor film comprises a {11$\bar{2}$2} semipolar III-nitride semiconductor film.

5. A device using the film of claim 1.

6. The film of claim 1, wherein the nitride nucleation or buffer layer is a first nitride nucleation or buffer layer deposited on a substrate.

7. The film of claim 6, wherein the first nitride buffer or nucleation layer comprises III-nitride or an alloy composition of (Ga,Al,In,B)N having a formula $Ga_nAl_xIn_yB_zN$ where $0 \leq n \leq 1, 0 \leq x \leq 1, 0 \leq y \leq 1, 0 \leq z \leq 1$ and $n+x+y+z=1$.

8. The film of claim 7, wherein the substrate is Gallium Nitride and the semipolar III-nitride semiconductor film comprises an alloy composition of (Ga,Al,In,B)N semiconductors having a formula $Ga_nAl_xIn_yB_zN$ where $0 \leq n \leq 1, 0 \leq x \leq 1, 0 \leq y \leq 1, 0 \leq z \leq 1$ and $n+x+y+z=1$.

9. The film of claim 8, wherein the semipolar III-nitride semiconductor film comprises a {10$\bar{1}$3} semipolar gallium nitride film.

10. The film of claim 8, wherein the semipolar III-nitride semiconductor film comprises a {10$\bar{1}$1} semipolar gallium nitride film.

11. A method of fabricating a semiconductor film, comprising: depositing a semipolar III-nitride semiconductor film on a nitride nucleation or buffer layer, wherein:
the nitride nucleation or buffer layer includes at least some indium,
a surface area greater than 10 microns wide of the semipolar III-nitride semiconductor film is substantially parallel to a substrate surface upon which the nitride nucleation or buffer layer is grown, and
the semipolar III-nitride semiconductor film has a surface morphology comprising a planar film surface with fewer surface undulations and a reduced number of crystallographic defects as compared to a semipolar III-nitride semiconductor film grown without the nucleation or buffer layer.

12. The method of claim 11, wherein the nitride nucleation or buffer layer is grown on a (10$\bar{1}$0) sapphire substrate.

13. The method of claim 11, wherein the nitride nucleation or buffer layer is grown on an {11$\bar{2}$2} gallium nitride template grown on a (10$\bar{1}$0) sapphire substrate.

14. The method of claim 11, wherein the semipolar III-nitride semiconductor film comprises a {11$\bar{2}$2} semipolar nitride semiconductor film.

15. A film fabricated using the method of claim 11.

16. The method of claim 11, wherein the nitride nucleation or buffer layer is a first nitride nucleation or buffer layer deposited on a substrate.

17. The method of claim 16, wherein the first nitride buffer or nucleation layer comprises III-nitride or an alloy composition of (Ga,Al,In,B)N having a formula $Ga_nAl_xIn_yB_zN$ where $0 \leq n \leq 1, 0 \leq x \leq 1, 0 \leq y \leq 1, 0 \leq z \leq 1$ and $n+x+y+z=1$.

18. The method of claim 16, wherein the substrate comprises Gallium Nitride and the semipolar III-nitride semiconductor film comprises an alloy composition of (Ga,Al,In,B)N semiconductors having a formula $Ga_nAl_xIn_yB_zN$ where $0 \leq n \leq 1, 0 \leq x \leq 1, 0 \leq y \leq 1, 0 \leq z \leq 1$ and $n+x+y+z=1$.

19. The method of claim 18, wherein the semipolar III-nitride semiconductor film comprises a {10$\bar{1}$3} semipolar gallium nitride film.

20. The method of claim 18, wherein the semipolar III-nitride semiconductor film comprises a {10$\bar{1}$1} semipolar gallium nitride film.

* * * * *